(12) United States Patent
Tseng et al.

(10) Patent No.: US 12,009,226 B2
(45) Date of Patent: Jun. 11, 2024

(54) SEMICONDUCTOR DEVICE AND METHOD OF FORMING SAME

(71) Applicant: Taiwan Semiconductor Manufacturing Co., Ltd., Hsinchu (TW)

(72) Inventors: Ting-Chen Tseng, Hsinchu (TW); Sih-Hao Liao, New Taipei (TW); Yu-Hsiang Hu, Hsinchu (TW); Hung-Jui Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 199 days.

(21) Appl. No.: 17/458,663

(22) Filed: Aug. 27, 2021

(65) Prior Publication Data
US 2023/0063181 A1     Mar. 2, 2023

(51) Int. Cl.
*H01L 23/48* (2006.01)
*H01L 21/56* (2006.01)
*H01L 23/00* (2006.01)
*H01L 23/29* (2006.01)
*H01L 23/31* (2006.01)

(52) U.S. Cl.
CPC ............ *H01L 21/56* (2013.01); *H01L 23/293* (2013.01); *H01L 23/3157* (2013.01); *H01L 24/05* (2013.01); *H01L 24/19* (2013.01); *H01L 24/20* (2013.01); *H01L 24/97* (2013.01); *H01L 2224/2101* (2013.01); *H01L 2924/37001* (2013.01)

(58) Field of Classification Search
CPC ... H01L 21/56; H01L 21/565; H01L 23/3157; H01L 23/3185; H01L 24/19
USPC .......................................... 438/127; 257/774
See application file for complete search history.

(56) References Cited

U.S. PATENT DOCUMENTS

| | | | |
|---|---|---|---|
| 8,133,762 B2* | 3/2012 | Pagaila | H01L 23/528 438/117 |
| 8,980,691 B2* | 3/2015 | Lin | H01L 25/50 438/666 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |

(Continued)

FOREIGN PATENT DOCUMENTS

| | | |
|---|---|---|
| KR | 20210023345 A | 3/2021 |
| TW | 201539678 A | 10/2015 |
| TW | 202044507 A | 12/2020 |

*Primary Examiner* — Nitin Parekh
(74) *Attorney, Agent, or Firm* — Slater Matsil, LLP

(57) ABSTRACT

A method includes attaching an integrated circuit die adjacent to a first substrate, the integrated circuit die comprising: an active device in a second substrate; a pad adjacent to the second substrate; and a first dielectric layer adjacent to the second substrate, the first dielectric layer comprising a polyimide with an ester group; forming an encapsulant around the integrated circuit die; and removing the first dielectric layer.

20 Claims, 19 Drawing Sheets

(56) References Cited

U.S. PATENT DOCUMENTS

| | | |
|---|---|---|
| 9,559,005 B2 | 1/2017 | Tsai et al. |
| 11,121,052 B2 | 9/2021 | Lai et al. |
| 11,195,774 B2 | 12/2021 | Lee |
| 2002/0027257 A1 | 3/2002 | Kinsman et al. |
| 2004/0113283 A1 | 6/2004 | Farnworth et al. |
| 2007/0083017 A1* | 4/2007 | Dueber ............. H01L 21/02282 525/530 |
| 2008/0246126 A1* | 10/2008 | Bowles ................... H01L 25/50 257/659 |
| 2016/0064338 A1 | 3/2016 | Miao et al. |
| 2017/0186655 A1 | 6/2017 | Chen |
| 2017/0323840 A1 | 11/2017 | Chiu et al. |
| 2018/0108636 A1* | 4/2018 | Chen ....................... H01L 24/80 |
| 2019/0148474 A1 | 5/2019 | Bu |
| 2019/0244947 A1 | 8/2019 | Yu et al. |
| 2020/0027838 A1* | 1/2020 | Yu ......................... H01L 21/565 |
| 2020/0043891 A1 | 2/2020 | Yu et al. |
| 2020/0168464 A1 | 5/2020 | Loh |
| 2021/0098636 A1 | 4/2021 | Tai et al. |
| 2021/0294213 A1* | 9/2021 | Hirata ................... G03F 7/0387 |
| 2022/0091505 A1* | 3/2022 | Liao .................... H01L 23/5389 |
| 2022/0181268 A1 | 6/2022 | Kung et al. |
| 2022/0291585 A1* | 9/2022 | Shimizu ................ G03F 7/0387 |

* cited by examiner

SEMICONDUCTOR DEVICE AND METHOD OF FORMING SAME

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5 through 11A and 12 through 17 illustrate cross-sectional views of intermediate steps during a process for forming a package component in accordance with some embodiments.

DETAILED DESCRIPTION

Figure 1:
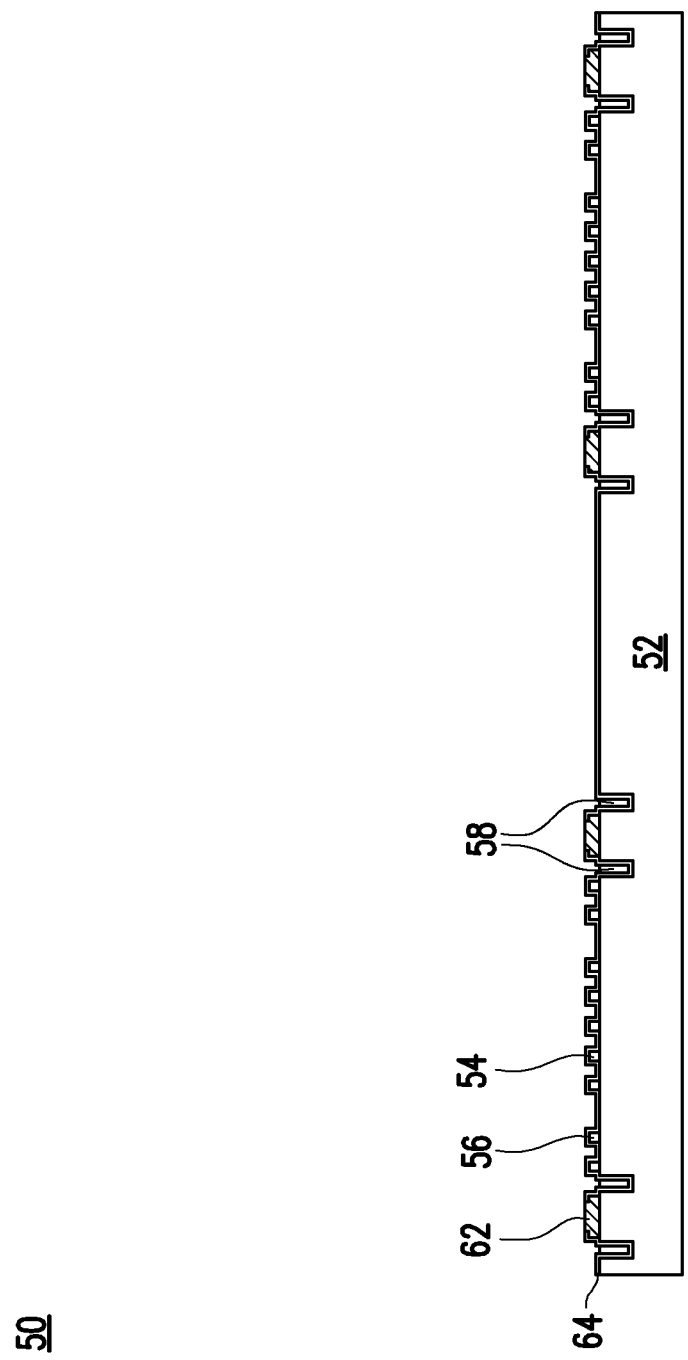
FIGS. 1 through 4 illustrate cross-sectional views of intermediate steps during a process for forming an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a semiconductor package comprising a plurality of package components. An integrated circuit die (e.g., a sensor die) may include a dielectric layer formed with strength, durability, and flexibility while also having a chemical composition that may be removed quickly and efficiently in a subsequent step. The integrated circuit die may be attached to a substrate comprising a back-side redistribution structure and through vias, and an encapsulant may be formed around the integrated circuit die and the through vias. The dielectric layer may then be removed in order to form a front-side redistribution structure electrically coupled to the integrated circuit die and the through vias. This package component may then be attached to another package component to form the semiconductor package.

FIGS. 1 through 4 illustrate cross-sectional views of the formation of an integrated circuit die 50 in accordance with some embodiments. The integrated circuit die 50 will be packaged in subsequent processing to form an integrated circuit package. The integrated circuit die 50 may be a sensor die (e.g., an ultrasonic sensor), a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a micro-electro-mechanical-system (MEMS) die, a signal processing die (e.g., digital signal processing (DSP) die), a front-end die (e.g., analog front-end (AFE) dies), the like, or combinations thereof. As illustrated, in accordance with some embodiments, the integrated circuit die 50 is a sensor die, such as an ultrasonic sensor (e.g., an ultrasonic fingerprint sensor), a light sensor, an image sensor, or any suitable type of sensor as desired.

In FIG. 1, the integrated circuit die 5o includes a substrate 52, for example, a semiconductor substrate, such as silicon, doped or undoped, or an active layer of a semiconductor-on-insulator (SOI) substrate, wherein the substrate 52 may be formed in a wafer, which may include different device regions that are singulated in subsequent steps to form a plurality of integrated circuit dies 50. The substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 has an active surface (e.g., the surface facing upwards in FIG. 1), sometimes called a front side, and an inactive surface (e.g., the surface facing downwards in FIG. 1), sometimes called a back side. The substrate 52 may have a thickness of between about 170 μm and about 190 μm.

Although not separately illustrated, the substrate 52 may in some embodiments also include several other features to form an integrated circuit. For example, the substrate 52 may include devices formed in and over the semiconductor substrate. The devices may be active devices (e.g., transistors, diodes, etc.), capacitors, resistors, etc. An inter-layer dielectric (ILD) is disposed over the front surface of the substrate 52, and an interconnect structure, including a plurality of metallization patterns, is disposed over and electrically coupled to the devices. The interconnect structure interconnects the devices to form the integrated circuit. The metallization patterns include metal lines and vias formed in one or more low-k dielectric layers.

The interconnect structure is electrically coupled to features disposed on or along the surface of the substrate 52. As illustrated, in embodiments in which the integrated circuit die 50 is a sensor such as an ultrasonic sensor, the integrated circuit die 50 may include sensing elements 54 and/or dummy elements 56 (e.g., dummy pads) on or along the surface of the substrate 52. Each sensing element 54 may be any suitable for generating, transmitting, and/or making, for example, a signal or pulse based on the type of sensor that is desired. For example, in an embodiment in which the sensor is an ultrasonic sensor, the sensing element 54 may include a piezoelectric transducer, responsive to ultrasonic forces, that is electrically coupled to one or more electrodes and the integrated circuit formed within the substrate 52.

The integrated circuit die 50 further includes pads 62, such as aluminum pads, such as input/output (I/O) regions to which external connections are made. The pads 62 are also on the active side of the substrate 52 of the integrated circuit die 50, such as in and/or on the interconnect structure. The pads 62 may be separated from the sensing elements 54 and the dummy elements 56 by an isolation region 58 in order to reduce any unwanted electrical effect the pads 62 may have on the sensing elements 54. One or more passivation films 64 are on the integrated circuit die 50, such as on portions of the pads 62, the sensing elements 54, and the dummy elements 56. As illustrated, openings extend through the passivation films 64 to the pads 62. The passivation film 64 may comprise, for example, silicon oxynitride ($SiON_x$).

Figure 2:
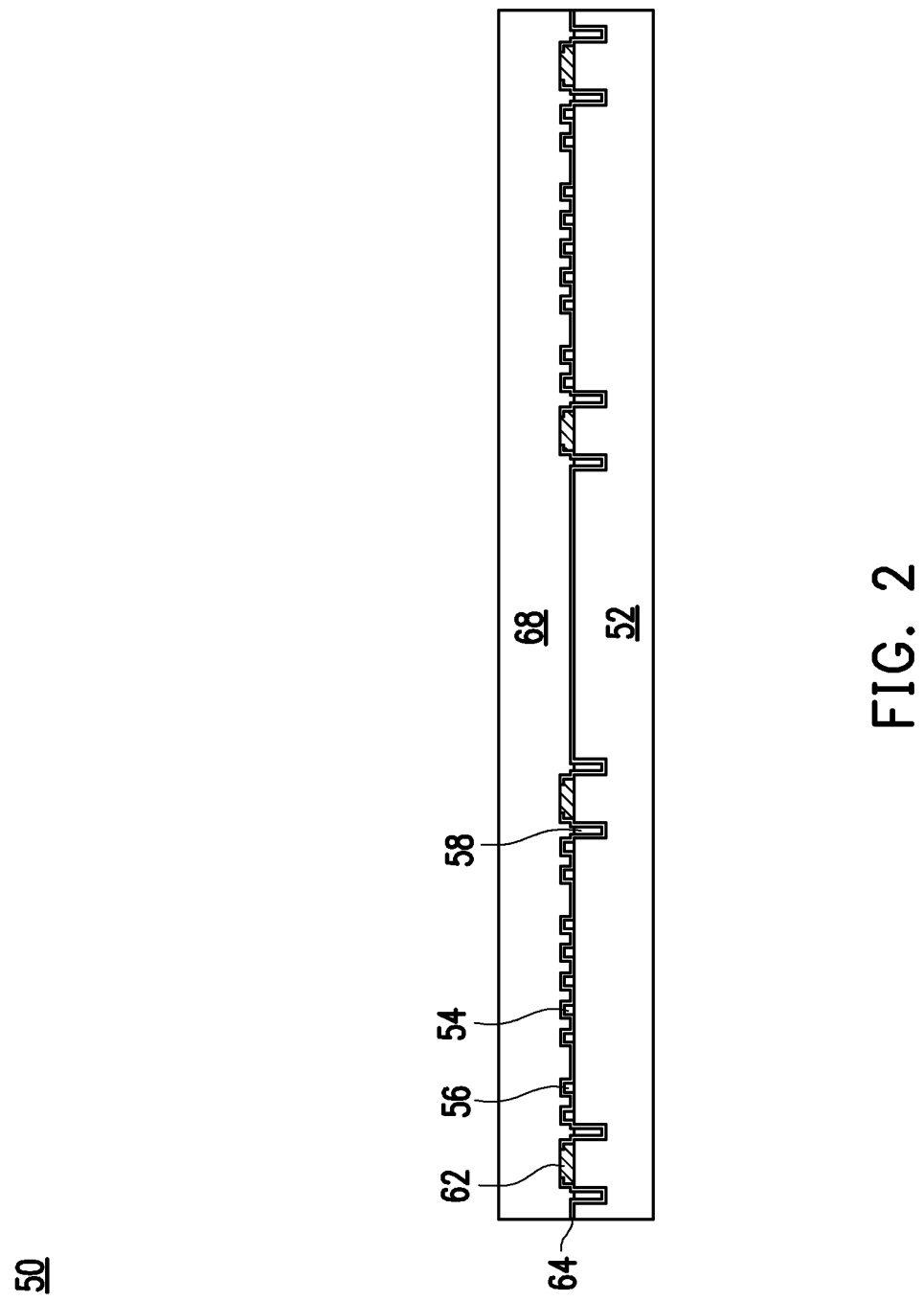

In FIG. 2, a dielectric layer 68 may be formed over the structure. The dielectric layer 68 may be selected for stability, tensile strength, and flexibility in order to remain stable in subsequent processing steps, during storage or transportation, and/or when packaged into a semiconductor device. For example, the dielectric layer 68 should have a high glass transition temperature $T_g$, a high decomposition temperature $T_d$ as well as a good tensile strength and Young's Modulus. The dielectric layer 68 may be a polymer such as a polyimide, a polybenzoxazole (PBO), benzocyclobutane (BCB), or the like; a nitride such as silicon nitride or the like; an oxide such as silicon oxide, phosphosilicate glass (PSG), borosilicate glass (BSG), borophosphosilicate glass (BPSG), or the like; the like, or a combination thereof. The dielectric layer 68 may be formed, for example, by spin coating, lamination, chemical vapor deposition (CVD), or the like. For example, the dielectric layer 68 may be formed by applying a polymer mixture to the structure, such as using a spin coating process. The polymer mixture may include a polymer base and a solvent.

In some embodiments, the polymer base includes a polyimide repeating unit. The polyimide repeating unit may further include an electron-attracting functional group FG capable of attracting a larger portion of the electron cloud in the molecule. As such, the electron-attracting functional group FG may draw electrons away from a portion of the repeating unit at or near the imide group. The electron-attracting functional group FG may be attached in series with the imide group as illustrated in the exemplary chemical structure below.

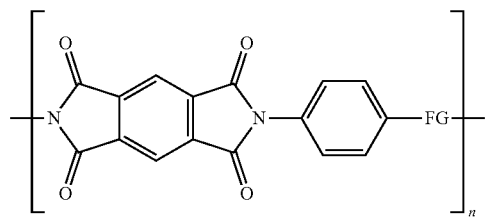

Exemplary chemical structures for the electron-attracting functional group FG may include strongly electronegative atoms (e.g., oxygen atoms), such as a carbonyl group including an ester group, as illustrated below. Variations of the chemical structure below may include carbon chains (including one or more carbons) in place of one or both of the oxygen atoms in each portion of the chain. Alternatively, the electron-attracting functional group FG may include anhydride, the like, or other suitable functional groups in series with the imide group.

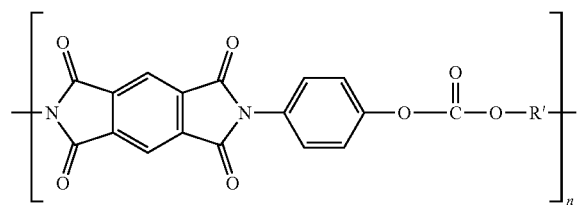

The solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropinates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

After applying the polymer mixture, a prebake process may be performed to evaporate some or all of the solvent. The prebake process may be performed at a temperature of between about 90° C. and about 100° C. and for a duration of between about 3 minutes and about 10 minutes. After the prebake process, a curing process to crosslink the polymer base may be performed at a temperature of between about 225° C. and about 230° C., and for a duration of between about 60 minutes and about 65 minutes. The dielectric layer 68 may, for example, be formed to a thickness of between about 15 μm and about 30 μm.

The above-described polymer base and process for forming the dielectric layer 68 achieves several advantages. First, due to having a glass transition temperature $T_g$ of between about 243° C. and about 255° C. and a decomposition temperature $T_d$ of between about 340° C. and about 370° C., the dielectric layer 68 will remain stable at elevated processing temperatures that may be required in subsequent steps. Second, the dielectric layer 68 is additionally reliable during subsequent processing due to having a good tensile strength of between about 120 MPa and about 150 MPa and a relatively elastic Young's Modulus of between about 3.0 GPa and about 4.5 GPa, such as about 3.9 GPa. Third, the dielectric layer 68 may be efficiently etched in a subsequent processing step, such as by a wet etchant comprising a base, as described in greater detail below. In particular, the electron-attracting functional group facilitates a fast and high-yield reaction with other portions of the polymer structure, such as portions with a stronger positive charge near the imide group.

Figure 3:
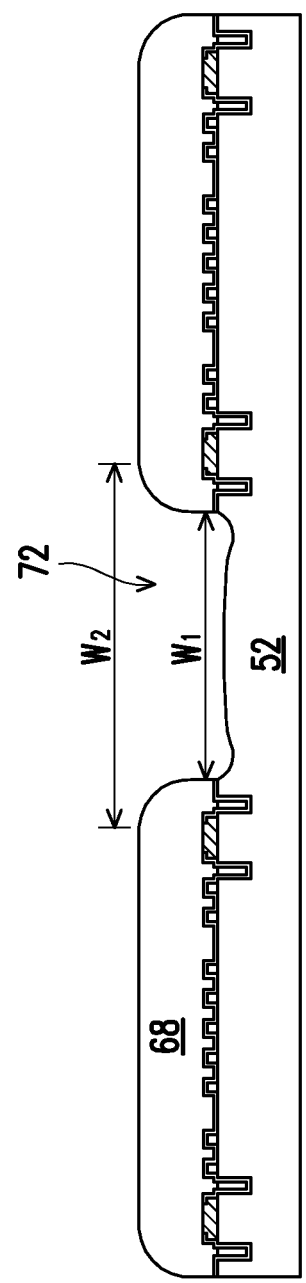

In FIG. 3, a grooving process, such as a laser grooving process may be performed to prepare each integrated circuit die 50 for singulation from the wafer. In an embodiment, the dielectric layer 68 and a portion of the substrate 52 may be patterned using, for example, a laser grooving or laser drilling method, by which a laser is directed towards those portions of the dielectric layer 68 which are desired to be removed in order to expose the underlying substrate 52. A benefit of the dielectric layer 68 includes maintaining strong adhesion to the substrate 52 and the passivation film 64 during the grooving process. For example, the polyimide (e.g., cyclic imide) portions of the molecules of the dielectric layer 68 may form multiple hydrogen bonds with the passivation film 64 to provide strong adhesion between the layers.

During the laser grooving process the drill energy may be in a range of between about 500 mJ and about 1000 mJ, and a drill angle of between about 0 degrees (perpendicular to a major surface of the dielectric layer 68) and about 90 degrees to normal of the major surface of the dielectric layer 68. In accordance with some embodiments, the grooving may be performed to form an opening 72 over the substrate 52 to indicate a scribe region of the substrate 52 to be sliced during a subsequent singulation.

As illustrated, the grooving may further shape the dielectric layer 68 to be angled with respect to the normal and have a convex curvature adjacent to the opening 72. The angle may be substantially the same as the drill angle used in the laser grooving process. Due to the angle and the convex curvature, the opening 72 may have a width $W_1$ proximal to the substrate 52 of between about 50 μm and about 60 μm and a width $W_2$ at or near an upper surface of the dielectric layer 68 of between about 70 μm and about 100 μm. In particular, the width $W_1$ may be about 65% of the width $W_2$. In some embodiments, the substrate 52 may also be grooved such that the substrate 52 has a convex upper surface near the middle of the opening 72. In addition, the substrate 52 may also have a concave upper surface on each side of the convex upper surface.

Figure 4:
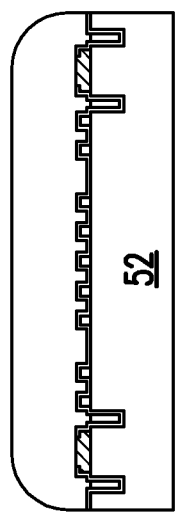
Figure 4:
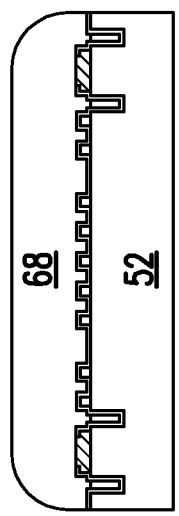

In FIG. 4, the integrated circuit die 50 is singulated from the wafer. In an embodiment, the singulation process may be performed by using a saw blade (not separately illustrated) to slice through the scribe region of the substrate 52 between adjacent portions of the dielectric layer 68 and at the opening 72. However, as one of ordinary skill in the art will recognize, utilizing a saw blade for the singulation process is merely one illustrative embodiment and is not intended to be limiting. Any method for performing the singulation process, such as utilizing one or more etches, may be utilized. These methods and any other suitable methods may be utilized to singulate the structure. As illustrated, following the singulation process, the dielectric layer 68 on each integrated circuit die 50 may retain the convex curvature described above.

FIGS. 5 through 11A and 12 through 17 illustrate cross-sectional views of intermediate steps during a process for forming a first package component 100, in accordance with some embodiments. A first package region 100A and a second package region 100B are illustrated and one or more of the integrated circuit dies 50 are packaged to form an integrated circuit package in each of the package regions 100A and 100B. The integrated circuit packages may also be referred to as integrated fan-out (InFO) packages.

Figure 5:
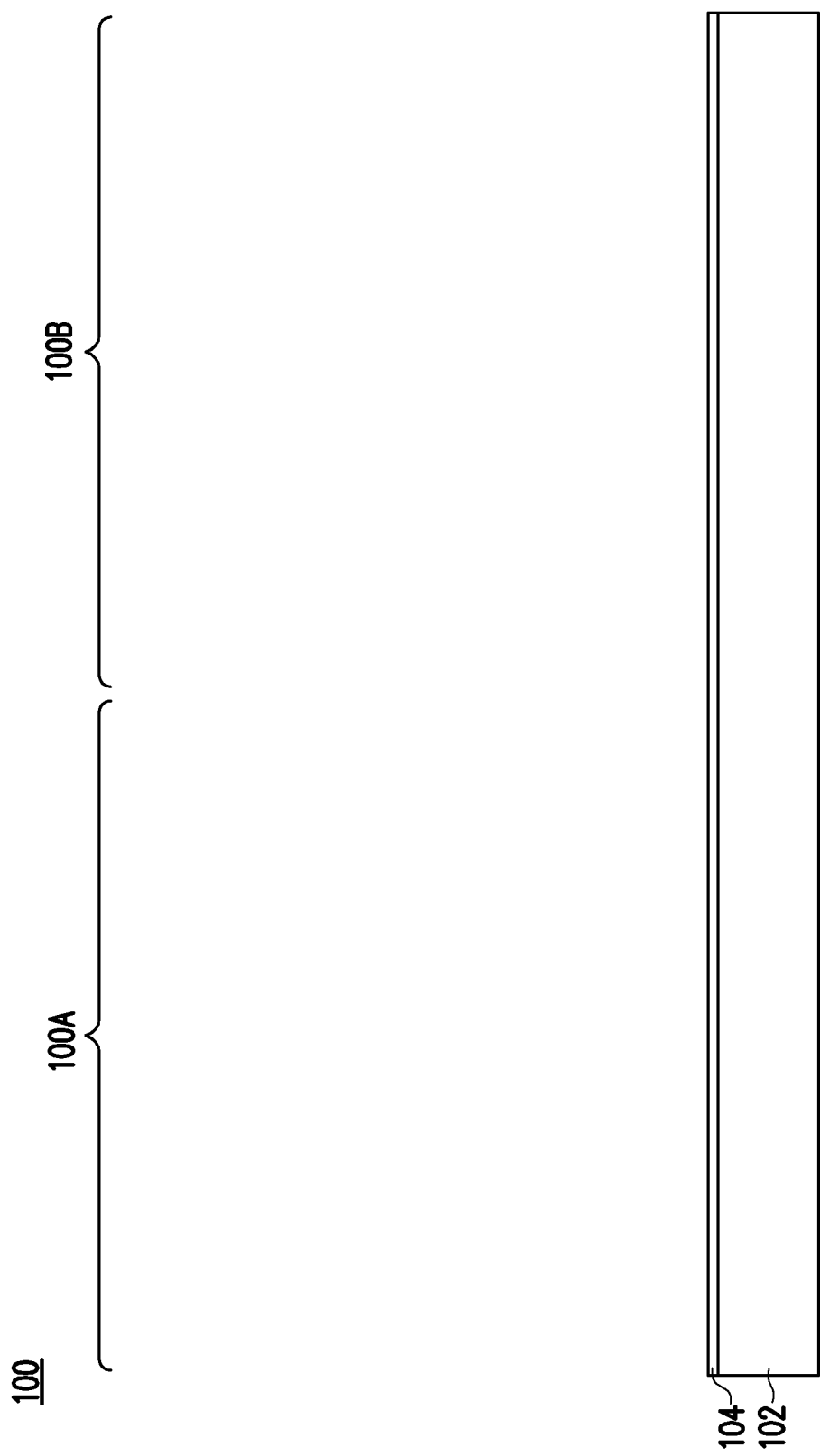

In FIG. 5, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be later removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 6:
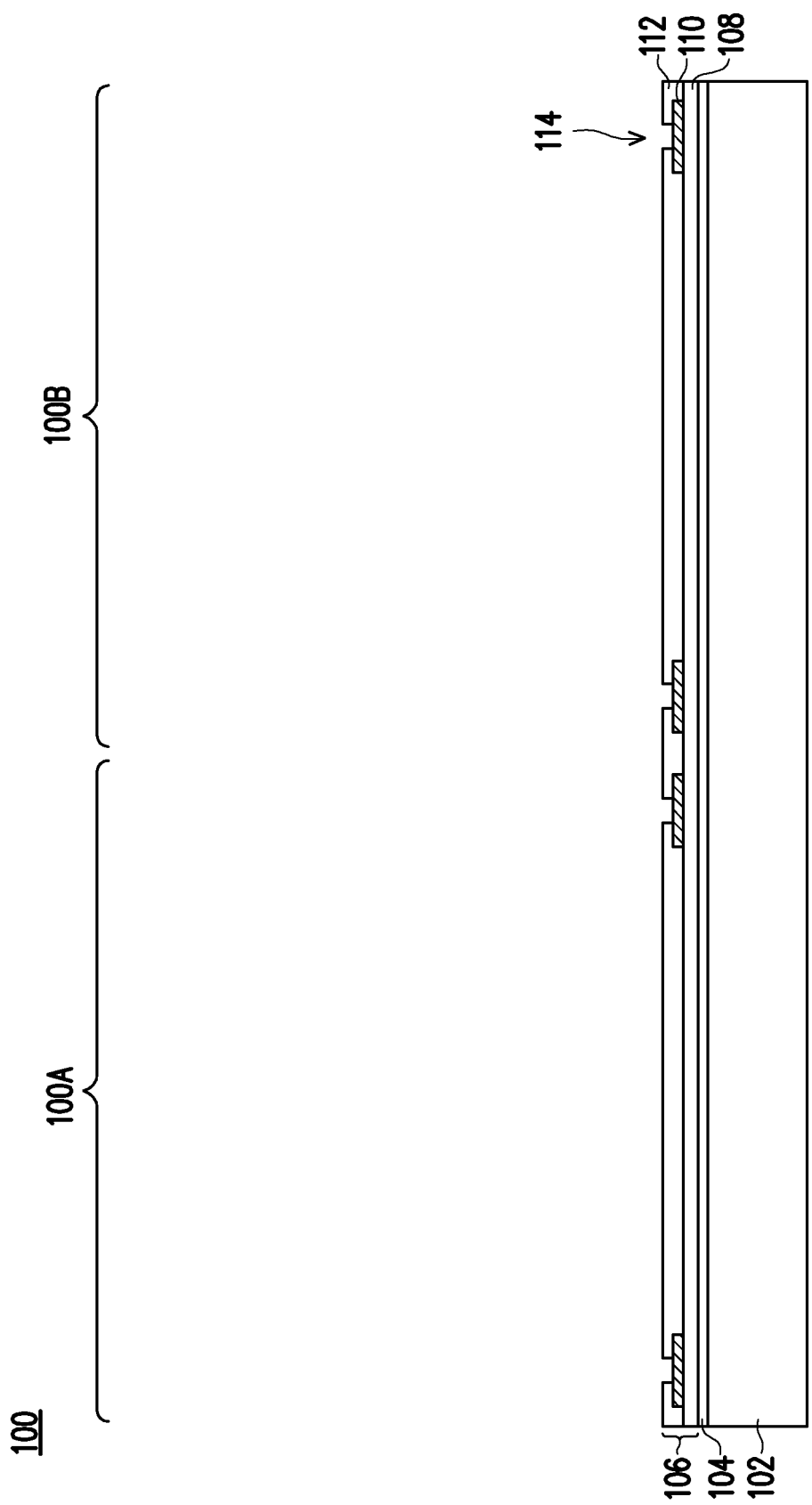

In FIG. 6, a back-side redistribution structure 106 may be formed on the release layer 104. In the embodiment shown, the back-side redistribution structure 106 includes a dielectric layer 108, a metallization pattern 110 (sometimes referred to as a redistribution layer or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer (not specifically illustrated) is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 112 can be developed after the exposure.

FIG. 6 illustrates the back-side redistribution structure 106 having a single metallization pattern 110 for illustrative purposes. In some embodiments, the back-side redistribution structure 106 may include any number of dielectric layers and metallization patterns. If more dielectric layers and metallization patterns are to be formed, steps and processes discussed above may be repeated. The metallization patterns may include one or more conductive elements. The conductive elements may be formed during the formation of the metallization pattern by forming the seed layer and conductive material of the metallization pattern over a surface of the underlying dielectric layer and in the opening of the underlying dielectric layer, thereby interconnecting and electrically coupling various conductive lines.

Figure 7:
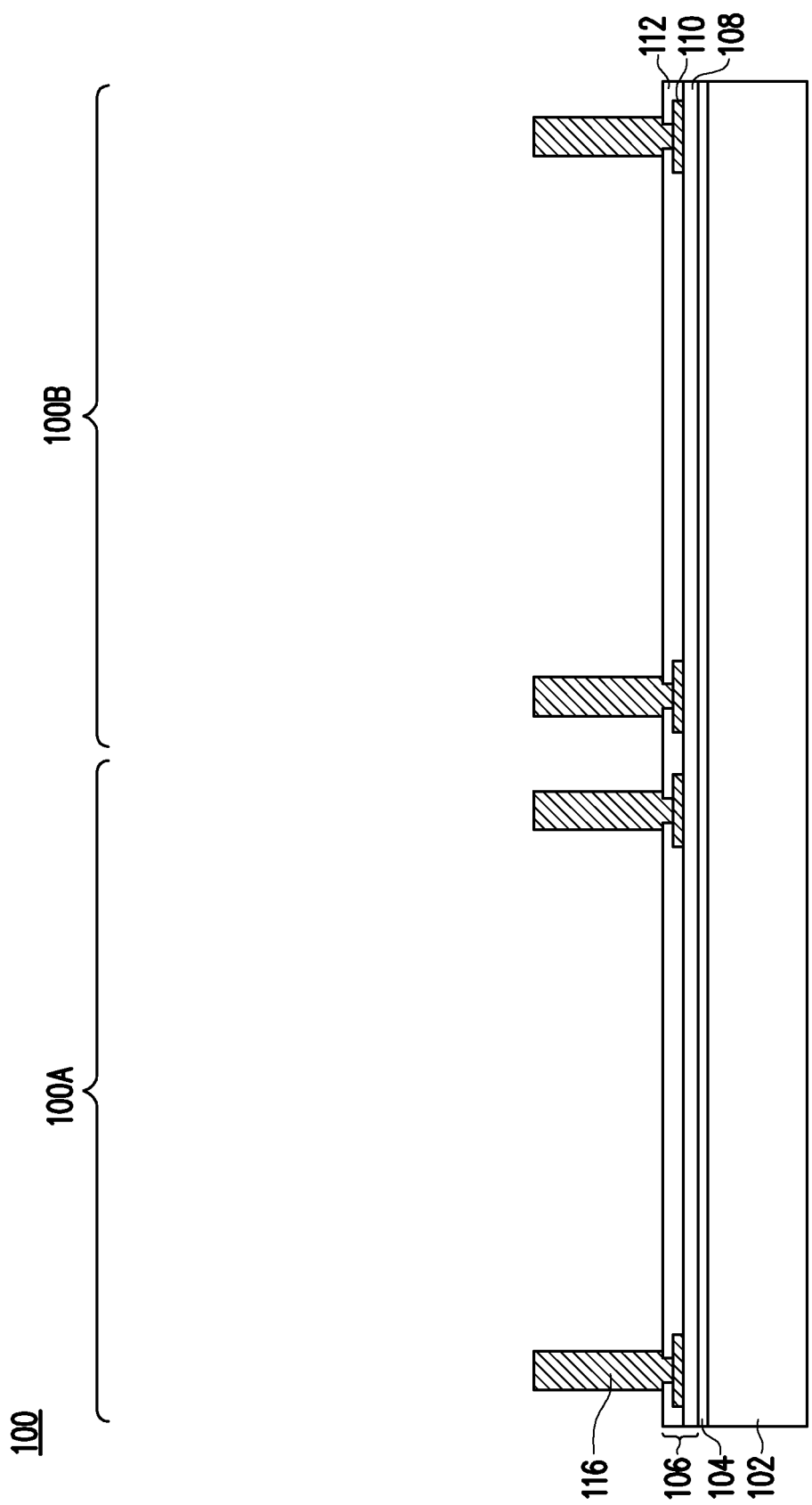

In FIG. 7, through vias 116 are formed in the openings 114 and extending away from the topmost dielectric layer (e.g., the dielectric layer 112) of the back-side redistribution structure 106. As an example to form the through vias 116, a seed layer (not shown) is formed over the back-side redistribution structure 106, for example, on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the layout of the through vias 116. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116. Each of the through vias 116 may have a height of between about 245 µm and about 255 µm, such as about 246.5 µm, and a width of between about 270 µm and about 290 µm, such as about 280 µm.

Figure 8:
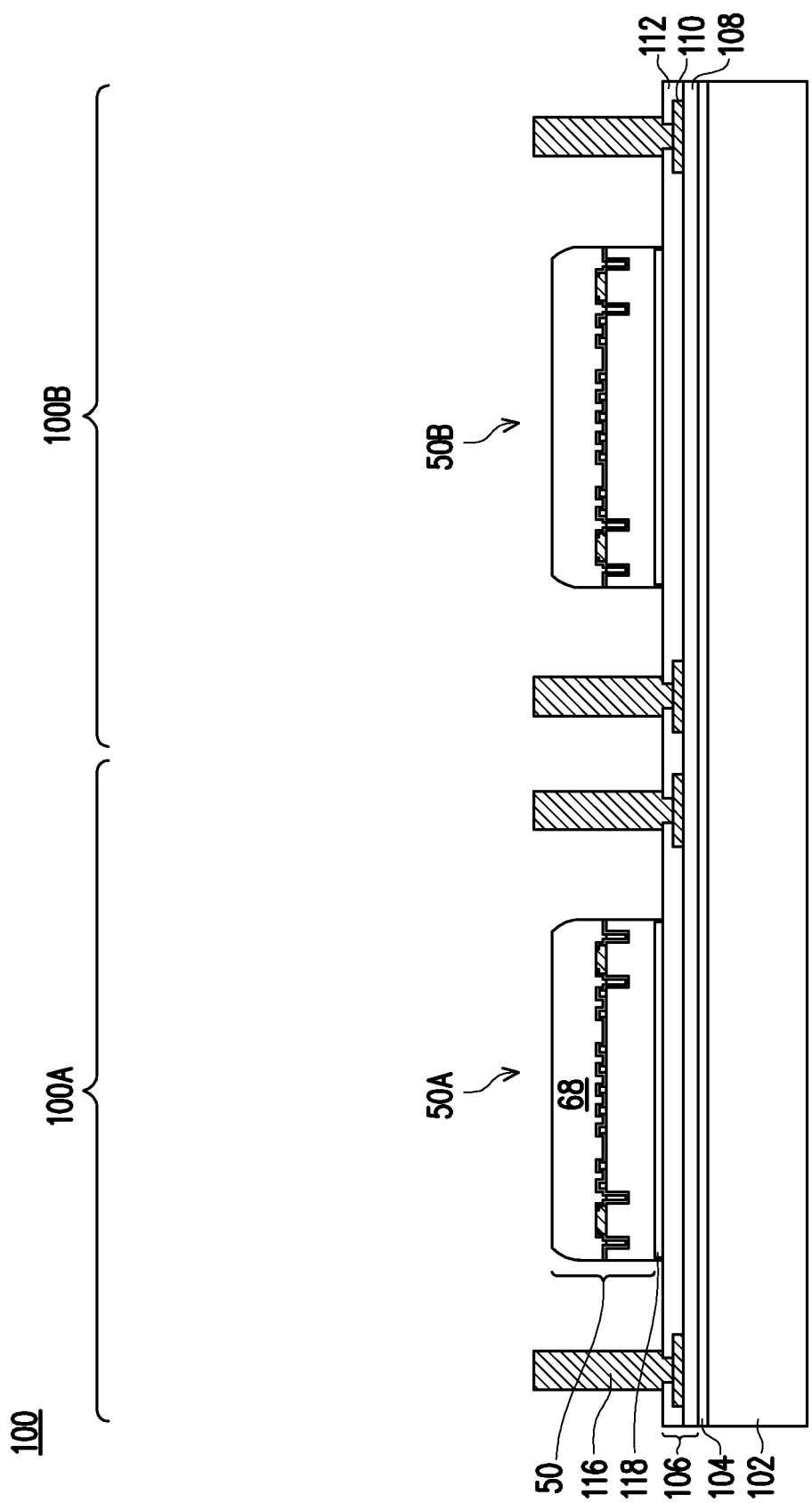

In FIG. 8, the integrated circuit dies 50 (e.g., a first integrated circuit die 50A and a second integrated circuit die 50B—see, e.g., FIG. 4) are adhered to the dielectric layer 112 by an adhesive 118 in the package regions 100A and 100B. In some embodiments not specifically illustrated, multiple integrated circuit dies 50 may be adhered adjacent one another, including the first integrated circuit die 50A and the second integrated circuit die 50B in each of the first package region 100A and the second package region 100B, respectively.

The first integrated circuit die 50A and the second integrated circuit die 50B may be the same type of dies, such as sensor dies. In other embodiments, one of the first integrated circuit die 50A and the second integrated circuit die 50B may be a sensor die while the other may be a logic device or a memory device. For example, the logic device may be a central processing unit (CPU), a graphics processing unit (GPU), a system-on-a-chip (SoC), a microcontroller, or the like, or the memory device may be a dynamic random access memory (DRAM) die, a static random access memory (SRAM) die, a hybrid memory cube (HMC) module, a high bandwidth memory (HBM) module, or the like. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the first package region 100A and the second package region 100B may be limited, particularly when one of the integrated circuit dies 50 includes devices with a large footprint, such as SoCs. Use of the back-side redistribution structure 106 allows for an improved interconnect arrangement when the first package region 100A and the second package region 100B have limited space available for the through vias 116.

The adhesive 118 is on back-sides of the integrated circuit dies 50 and adheres the integrated circuit dies 50 to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50, may be applied over the surface of the carrier substrate 102 if no back-side redistribution structure 106 is utilized, or may be applied to an upper surface of the back-side redistribution structure 106 if applicable. For example, the adhesive 118 may be applied to the back-sides of the integrated circuit dies 50 before singulating discussed above to separate the integrated circuit dies 50.

Figure 9:
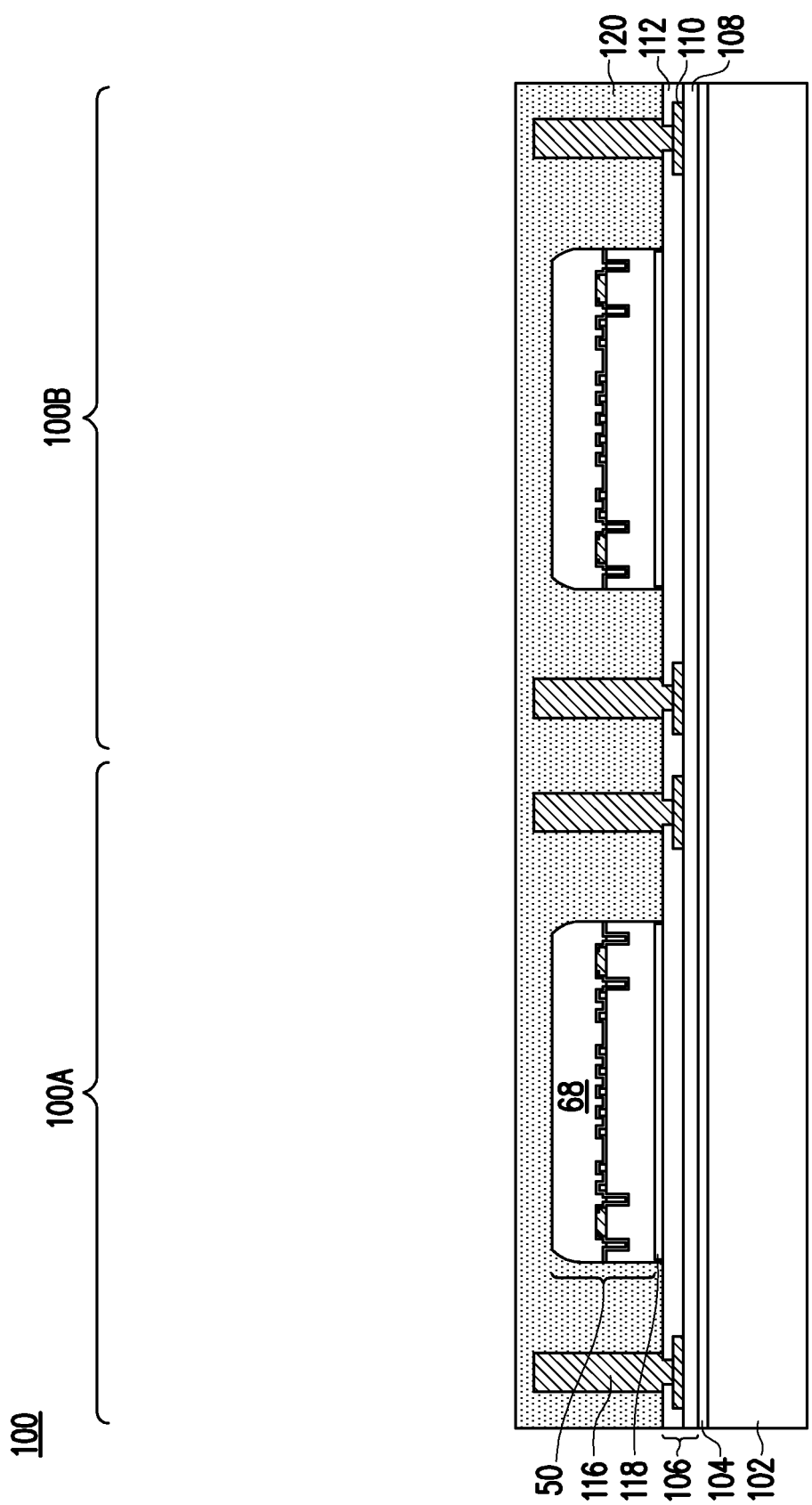

In FIG. 9, an encapsulant 120 is formed on and around the various components. After formation, the encapsulant 120 encapsulates the through vias 116 and the integrated circuit dies 50. The encapsulant 120 may be a molding compound, epoxy, or the like. The encapsulant 120 may be applied by compression molding, transfer molding, or the like, and may be formed over the carrier substrate 102 such that the through vias 116 and/or the integrated circuit dies 50 are buried or covered. The encapsulant 120 is further formed in gap regions between the integrated circuit dies 50 and follows the contours of the convex curvature of the sidewalls of the dielectric layer 68. The encapsulant 120 may be applied in liquid or semi-liquid form and then subsequently cured.

Figure 10:
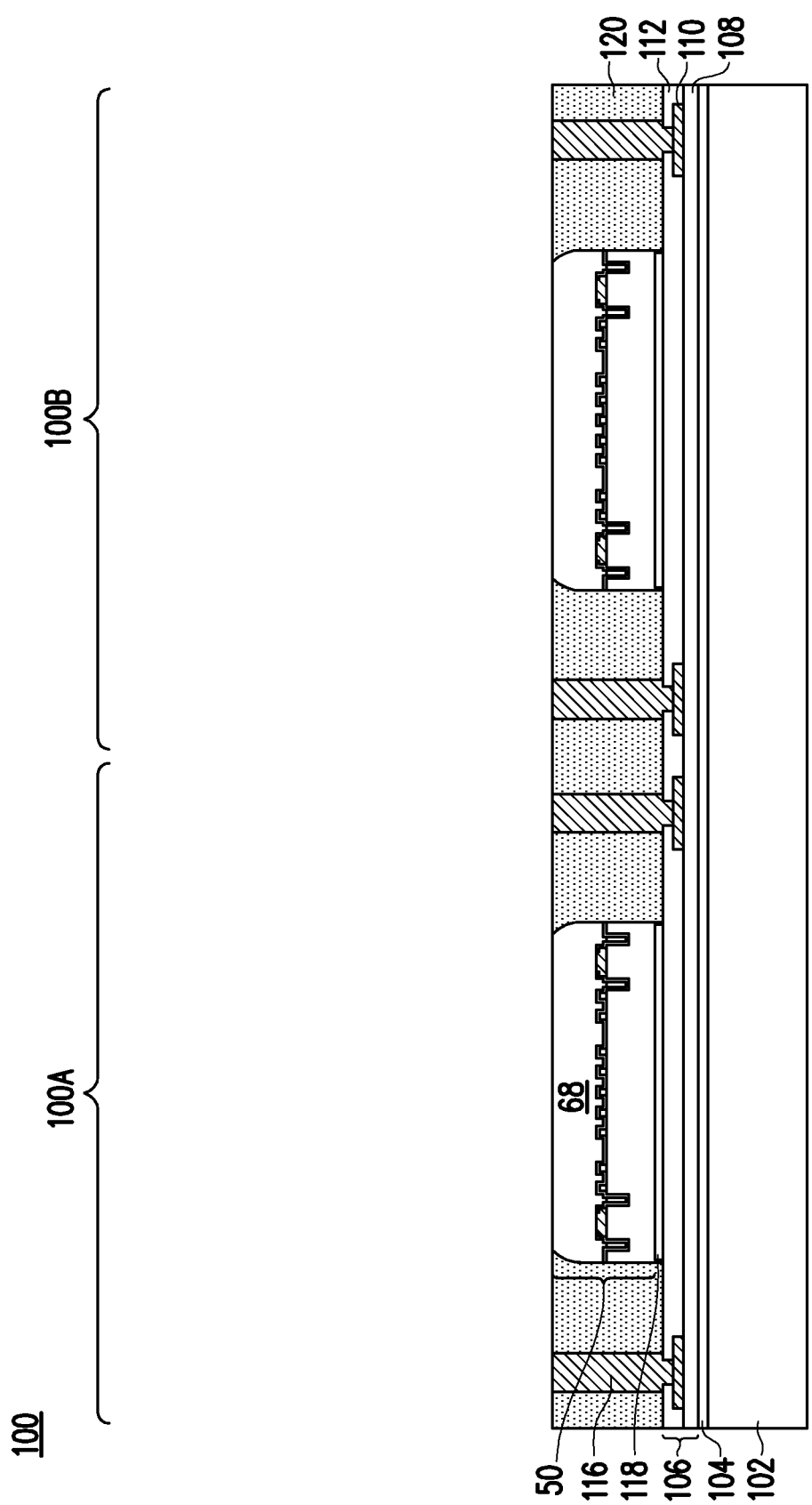

In FIG. 10, a planarization process is performed on the encapsulant 120 to expose the through vias 116 and the integrated circuit dies 50 (e.g., the dielectric layer 68). The planarization process may also remove material of the through vias 116 and the dielectric layer 68 until all of through vias 116 and the dielectric layer 68 are exposed. Top surfaces of the through vias 116, the dielectric layer 68, and the encapsulant 120 are substantially coplanar after the planarization process within process variations. The planarization process may be, for example, a chemical-mechanical polish (CMP), a grinding process, or the like. In some embodiments, the planarization may be omitted, for example, if the through vias 116 and/or the dielectric layer 68 are already exposed.

Figure 11A:
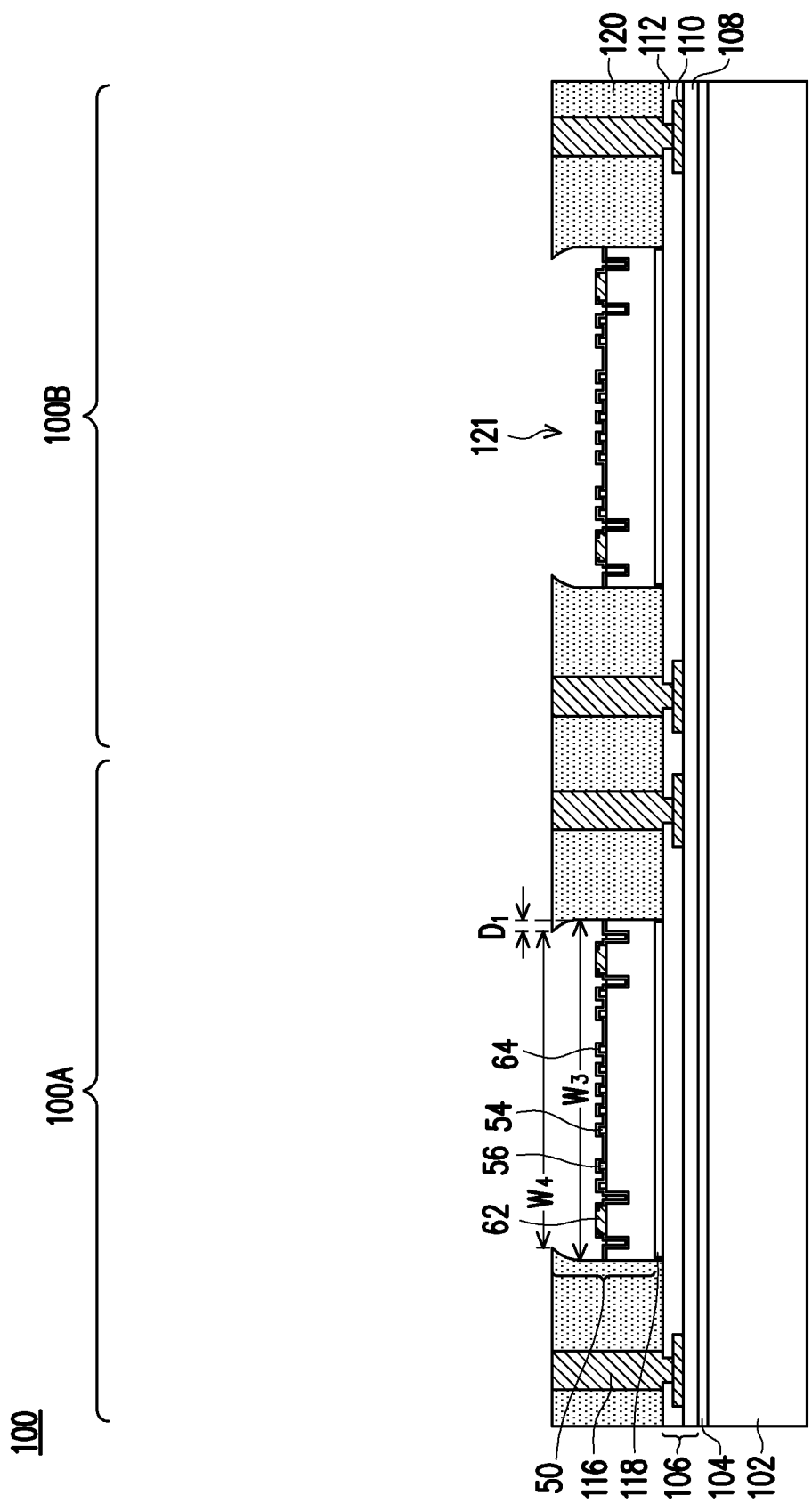

In FIG. 11A, the dielectric layer 68 is removed from each of the integrated circuit dies 50 to form openings 121 exposing the pads 62 and the passivation films 64. The dielectric layer 68 may be removed, for example, with an isotropic etch or an anisotropic etch using a wet or a dry etchant. As illustrated, following the removal of the dielectric layer 68, the encapsulant 120 may substantially retain its shape including overhanging the integrated circuit dies 50 from the previous convex curvature of the dielectric layer 68. For example, the opening 121 may have a width $W_3$ proximal to the substrate 52 of between about 30.5 mm and about 30.7 mm and a width $W_4$ at or near an upper surface of the encapsulant 120 of between about 30.49 mm and about 30.5 mm. In particular, the width $W_4$ may be between about 0.07% and about 0.13% less than (or about 99.93% and about 99.87%, respectively, of) the width $W_3$. As a result, the encapsulant may overhang the opening 121 by a distance $D_1$ of between about 10 μm and about 20 μm.

In accordance with embodiments using a wet etching process, the wet etchant may comprise a base, such as tetramethylammonium hydroxide (TMAH) in dimethyl sulfoxide (DMSO) and water, wherein the TMAH has a concentration by weight of between about 1% and about 2%. In addition, DMSO may have a concentration by weight of between about 96% and about 98%, and water may have a concentration by weight of between about 1% and about 2%. The wet etching process may be performed at a temperature of between about 48° C. and about 52° C., such as about 50° C. and for a duration of between about 3 minutes and about 10 minutes, such as about 6 minutes.

Figure 11B:
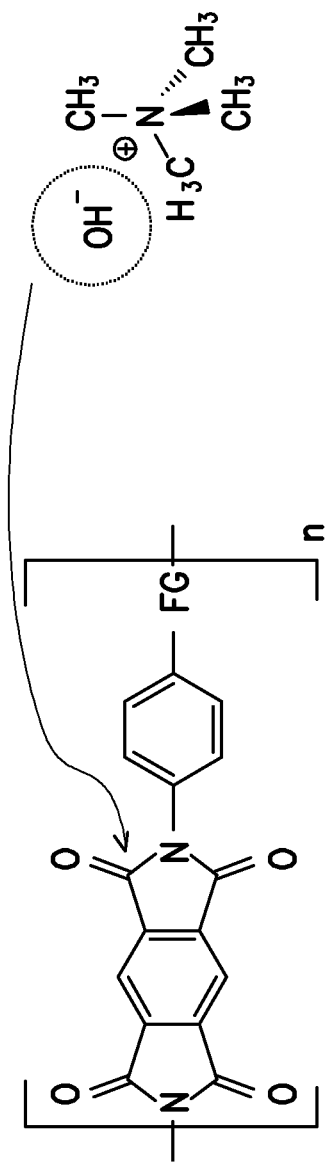
FIGS. 11B and 11C illustrate possible chemistry mechanisms for an intermediate step during a process for forming a package component in accordance with some embodiments.
Figure 11C:
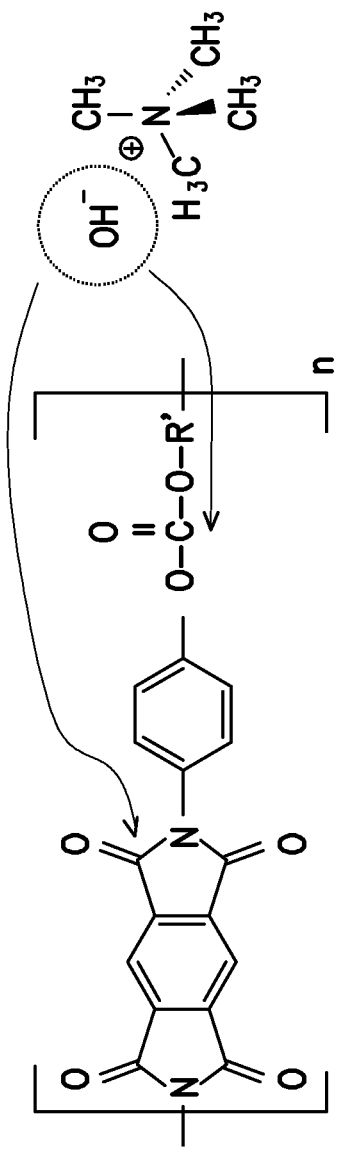

FIG. 11B illustrates a possible generic mechanism and FIG. 11C illustrates a possible specific mechanism for how the wet etchant (e.g., TMAH) may interact with and remove the dielectric layer 68. The wet etchant (e.g., the negatively charged portions of the base, such as the hydroxyl groups in TMAH) may attract positively charged regions of the dielectric layer 68. The electron-attracting functional group FG draws electrons of the molecules of the dielectric layer 68 away from other portions of the molecules. For example, the carbon atoms in the cyclic imide group may have a slight positive charge due to electrons being attracted to the electron-attracting functional group FG. As such, the TMAH may break apart the molecules of the dielectric layer 68 to be removed in the wet etching process.

Referring to FIG. 11C in which the molecules of the dielectric layer 68 may comprise an ester group as the electron-attracting functional group FG, additional sites of the molecule may attract the wet etchant. For example, in addition to the carbon atoms of the cyclic imide group, the carbon atom in the ester group may also have a slight positive charge due to electrons being attracted to the oxygen atoms of the ester group. As such, the molecules of the dielectric layer 68 comprising a polyimide with ester chemical structure may provide additional sites for the negatively charged portions of the base (e.g., TMAH) to efficiently break up the dielectric layer 68.

Alternatively, in embodiments using a dry etching process, the dry etchant may comprise oxygen ($O_2$), nitrogen ($N_2$), the like, or any combinations thereof. The dry etching process may be performed at a temperature of between about 23° C. and about 26° C., at a pressure of between about 45 Pa and about 55 Pa, and for a duration of between about 24 minutes and about 30 minutes, such as about 27 minutes.

An advantage of choosing the dielectric layer 68 to be the polyimide polymer comprising an ester group and formed as described above is to achieve improved efficiency and yield in the isotropic wet etching process described above using, for example, TMAH. As a result, the wet etching process may process more than about 9 wafers per hour, such as up to about 167 wafers per hour, as compared to the above described dry etching process, which may process about 9 wafers per hour. In addition, the wet etching process may be about three or four times less expensive than the dry etching process.

In FIGS. 12 through 15, a front-side redistribution structure 122 (see FIG. 15) is formed over the encapsulant 120, the through vias 116, and the integrated circuit dies 50. The front-side redistribution structure 122 includes dielectric layers 124 and 128 and metallization pattern 126. More dielectric layers and metallization patterns may be formed in the front-side redistribution structure 122. The metallization patterns may also be referred to as redistribution layers or redistribution lines. The front-side redistribution structure 122 is shown as an example having one metallization pattern. If more dielectric layers and metallization patterns are to be formed, steps and processes discussed below may be repeated.

Figure 12:
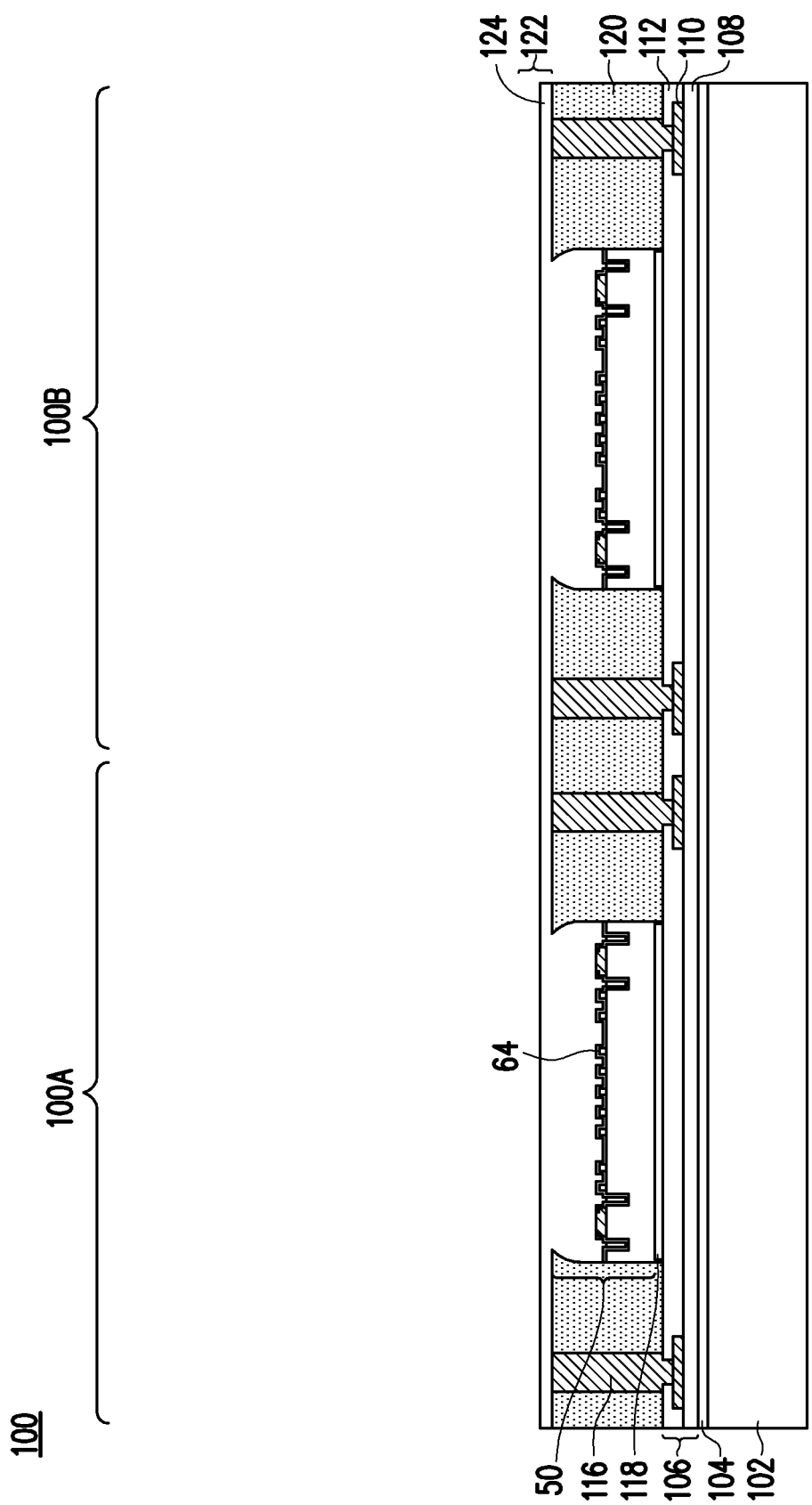

In FIG. 12, the dielectric layer 124 is deposited on the encapsulant 120, the through vias 116, and into the openings 121 over the substrate 52 of the integrated circuit dies 50. As illustrated, the dielectric layer 124 may substantially fill the openings 121. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. In some embodiments, a planarization process is performed to give the dielectric layer 124 a substantially planar upper surface. The dielectric layer 124 may have a thickness directly above the encapsulant 120 of between about 9 μm and about 11 μm, such as about 10 μm.

Figure 13:
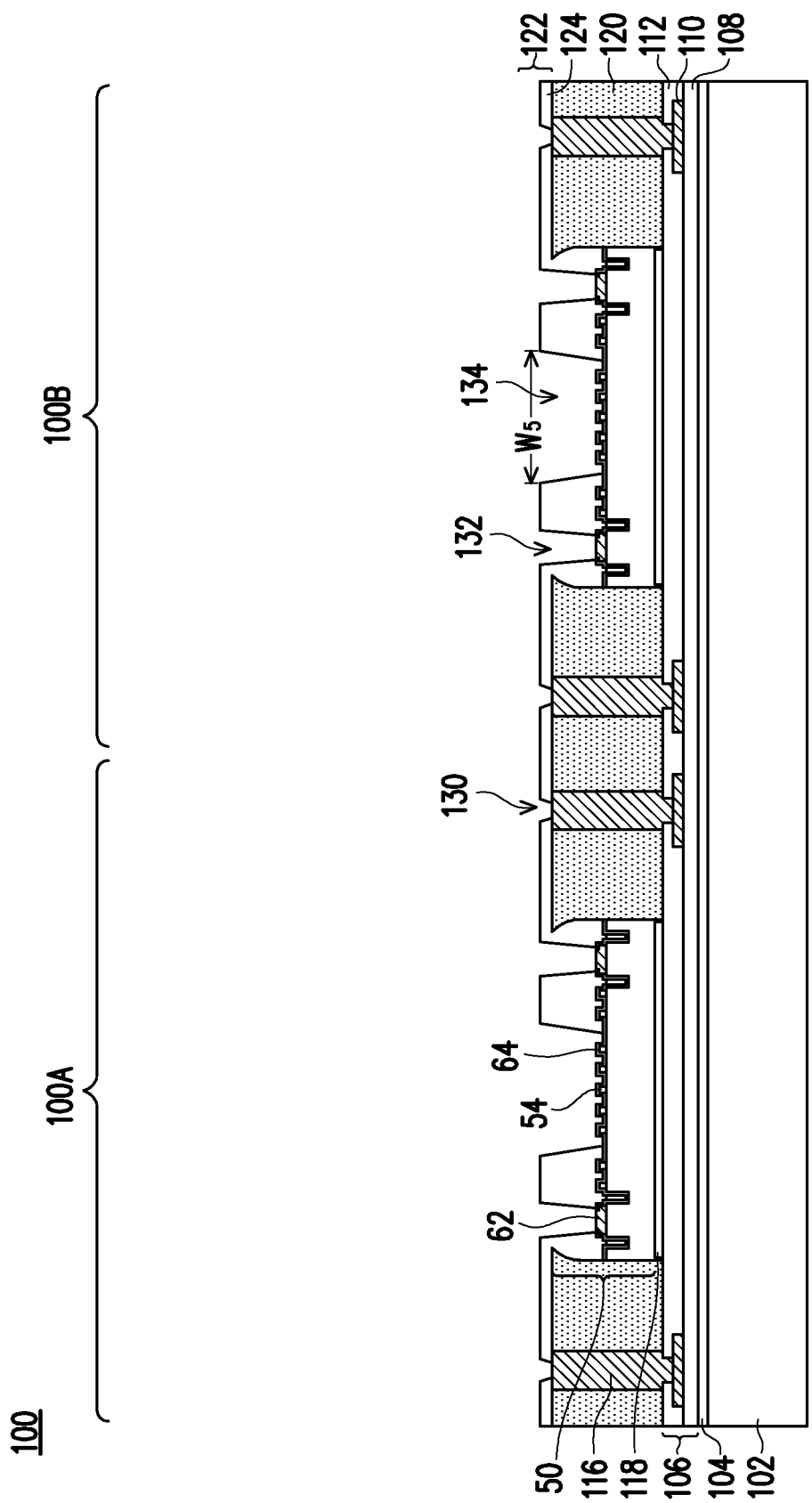

In FIG. 13, the dielectric layer 124 is then patterned. The patterning forms openings 130 exposing portions of the through vias 116, openings 132 exposing portions of the pads 62, and openings 134 exposing the passivation film 64 directly over the sensing elements 54. The patterning may be by an acceptable process, such as by exposing and developing the dielectric layer 124 when the dielectric layer 124 is a photo-sensitive material or by etching using, for example, an anisotropic etch. In other embodiments, a mask layer (not specifically illustrated) may be formed and patterned over the dielectric layer 124, and exposed portions of the dielectric layer 124 may be removed by, for example, etching. The opening 134 may have a width $W_5$ of between about 29.3 mm and about 29.4 mm.

Figure 14:
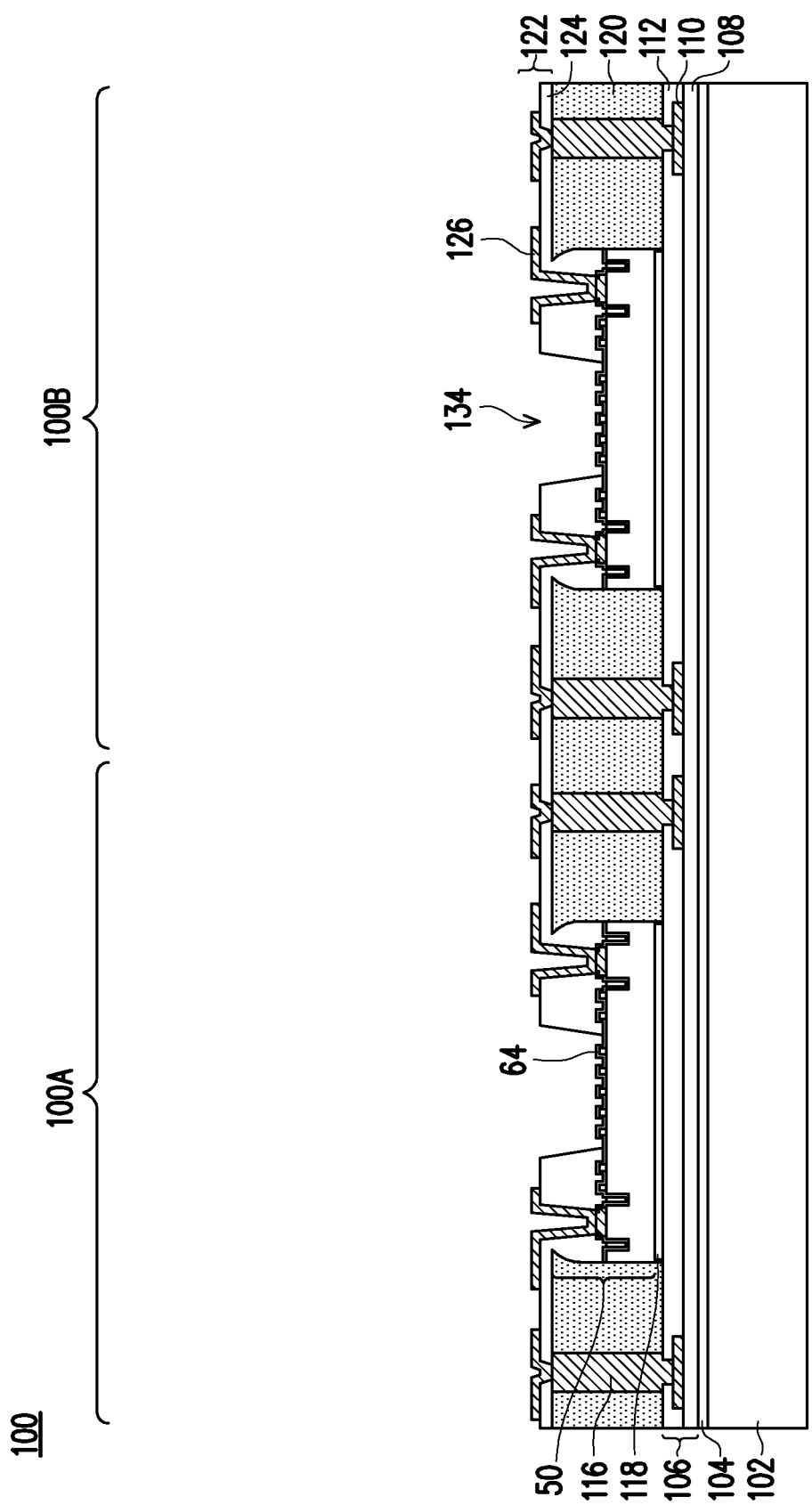

In FIG. 14, the metallization pattern 126 is then formed. The metallization pattern 126 includes conductive elements extending along the major surface of the dielectric layer 124 and extending through the dielectric layer 124 to physically and electrically couple to the through vias 116 and the pads 62 of the integrated circuit dies 50. As an example, to form the metallization pattern 126, a seed layer (not specifically illustrated) is formed over the dielectric layer 124 and in the openings (e.g., the openings 130, the openings 132, and the openings 134) extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer (including portions of the seed layer within the openings 130 over the through vias 116 and the openings 132 over the pads 62). A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer (including portions of the photoresist and the seed layer within the openings 134 over the sensing elements 54) on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The metallization pattern may have a thickness of between about 4 μm and about 5 μm, such as about 4.5 μm.

Figure 15:
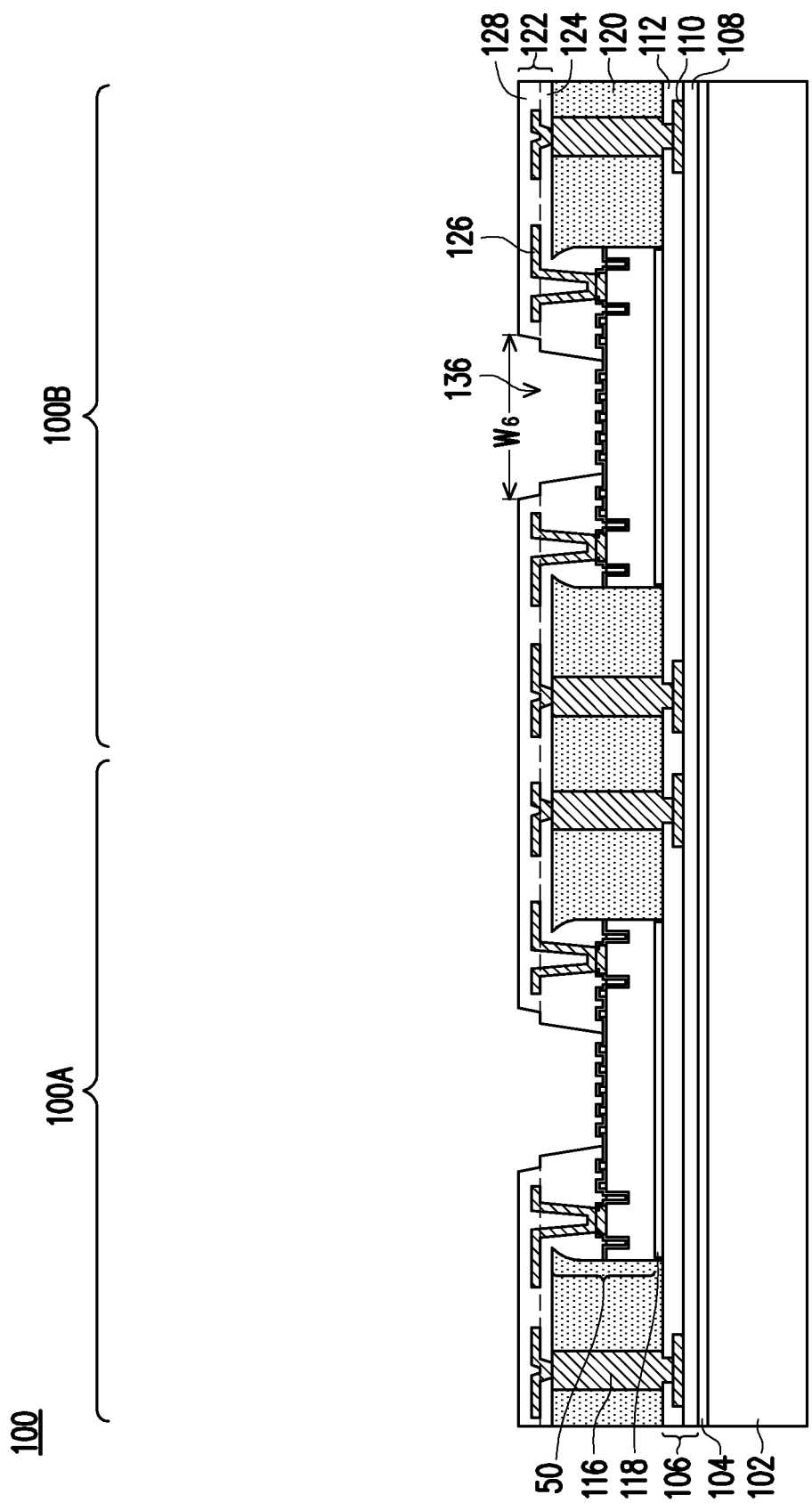

In FIG. 15, the dielectric layer 128 is deposited on the metallization pattern 126 and the dielectric layer 124. The dielectric layer 128 may be formed in a manner similar to the dielectric layer 124, and may be formed of a similar material as the dielectric layer 124. In addition, the dielectric layer 128 may be patterned similarly to the dielectric layer 124 to form opening 136. For example, the patterning may be by an acceptable process, such as by exposing and developing the dielectric layer 128 to light when the dielectric layer 128 is a photo-sensitive material or by etching using, for example, an anisotropic etch. The opening 136 may have a different or substantially a same lateral width as the opening 134 through the dielectric layer 124 and a greater lateral width through the dielectric layer 128. For example, the opening 136 may have a width $W_6$ of between about 29.35 mm and about 29.39 mm. Additional metallization patterns and dielectric layers, if any, may then be formed. In other embodiments, the openings 134 may not be formed during the patterning of the dielectric layer 124 as discussed above. For example, the openings 136 may be formed by simultaneously patterning the dielectric layer 124 and the dielectric layer 128. The dielectric layer 128 may have a thickness directly above the encapsulant 120 of between about 8.5 μm and about 11 μm, such as about 9 μm.

Although not specifically illustrated, in embodiments in which the integrated circuit dies 50 are desired to be connected through the dielectric layer 128, UBMs may be formed for external connection to the front-side redistribution structure 122, for example, for some integrated circuit dies 50 that are logic devices or memory devices. In accordance with some embodiments and as discussed below, the integrated circuit dies 50 that are logic devices or memory devices may have external connections through the metallization pattern 126 to the through vias 116 and through the back-side redistribution structure 106. In accordance with some embodiments, the package regions (e.g., the first package region 100A and/or the second package region 100B) that include integrated circuit dies 50 that are sensor dies may remain free of the UBMs.

Figure 16:
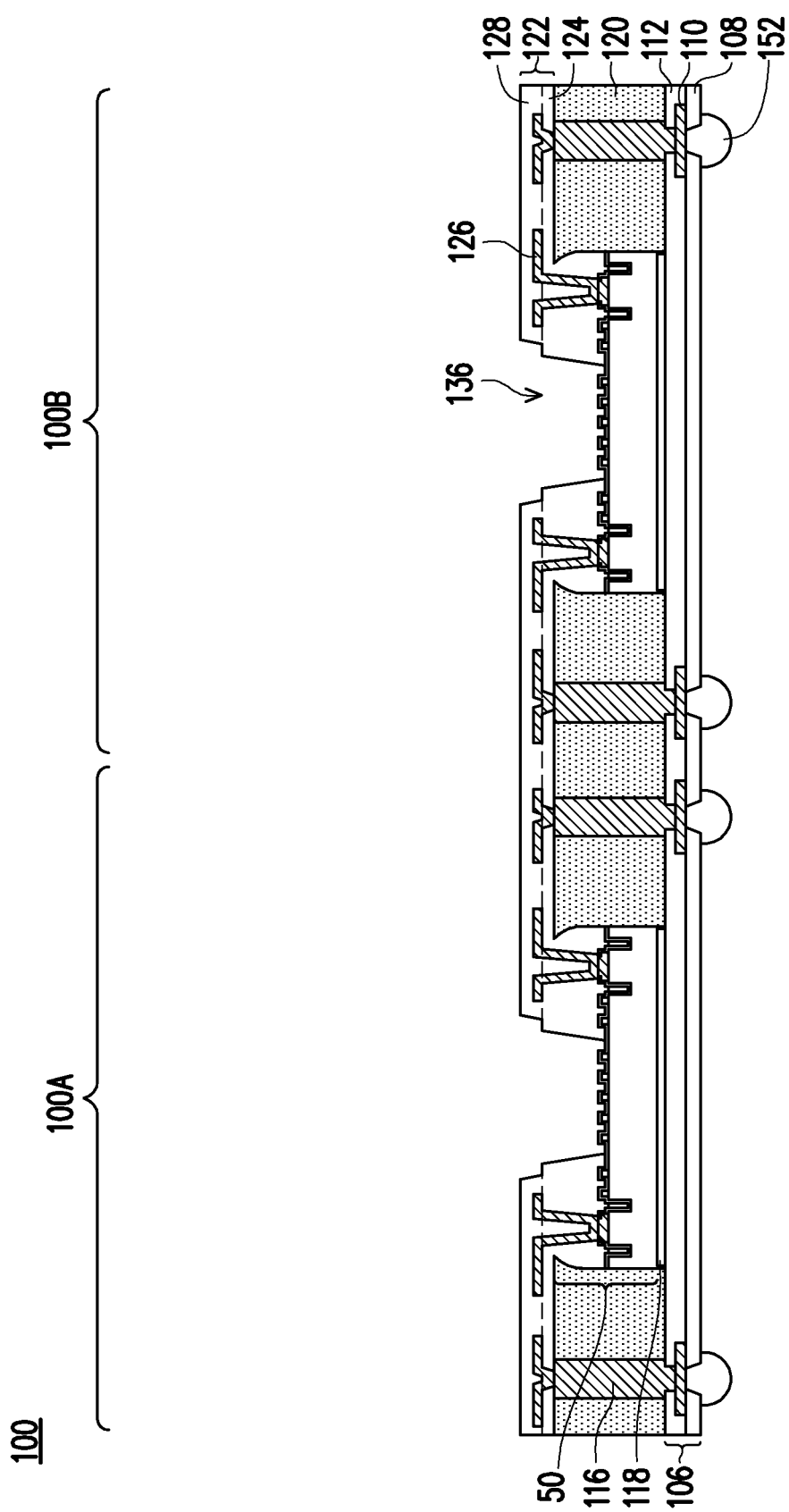

In FIG. 16, a carrier substrate de-bonding is performed to detach (or "de-bond") the carrier substrate 102 from the back-side redistribution structure 106 (e.g., the dielectric layer 108). In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape (not shown).

Further in FIG. 16, conductive connectors 152 are formed extending through the dielectric layer 108 to contact the metallization pattern 110. Openings are formed through the dielectric layer 108 to expose portions of the metallization pattern 110. The openings may be formed, for example, using laser drilling, etching, or the like. The conductive connectors 152 are formed in the openings. In some embodiments, the conductive connectors 152 comprise flux and are formed in a flux dipping process. In some embodiments, the conductive connectors 152 comprise a conductive paste such as solder paste, silver paste, or the like, and are dispensed in a printing process. The conductive connectors 152 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 152 may include a conductive material such as solder, copper, aluminum, gold, nickel, silver, palladium, tin, the like, or a combination thereof. In some embodiments, the conductive connectors 152 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 152 comprise metal pillars (such as copper pillars) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 17:
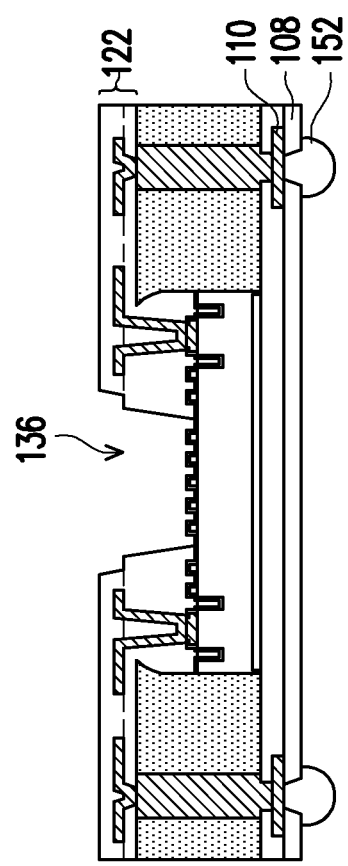

In FIG. 17, a singulation process is performed by sawing along scribe regions (not specifically illustrated), for example, between the first package region 100A and the second package region 100B. The sawing singulates the first package region 100A from the second package region 100B. The illustrated singulated device stack is either one of the first package region 100A or the second package region 100B. In other embodiments, the singulation process may be performed after the first package components 100 are coupled to the second package components 200 in the next step.

Figure 18:
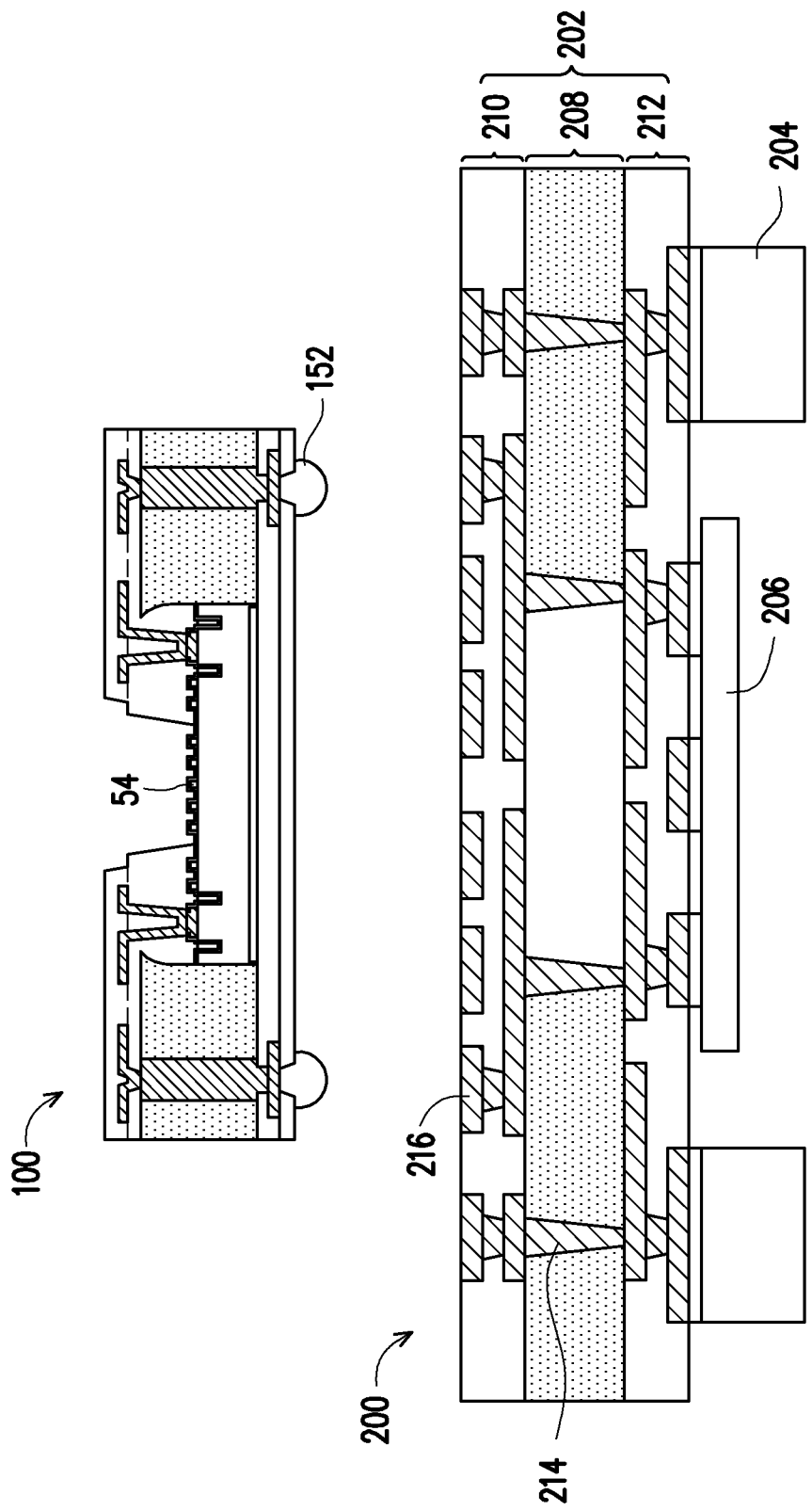
FIG. 18 illustrates a cross-sectional view of formation of a semiconductor package in accordance with some embodiments.

FIG. 18 illustrates formation and implementation of device stacks, in accordance with some embodiments. The device stacks are formed from the integrated circuit packages formed in the first package component 100. The device stacks may also be referred to as package-on-package (PoP) structures. The first package component 100 is coupled to a second package component 200 using the conductive connectors 152. In some embodiments not illustrated, more than one of the first package components 100 may be coupled to the second package component 200 using the conductive connectors 152.

The second package component 200 includes, for example, a substrate 202 (e.g., an interposer), one or more capacitors 204, and an interconnect structure 206 (e.g., a connector). The substrate 208 may include through vias 214 to electrically couple an upper redistribution structure 210 to a lower redistribution structure 212. For example the upper redistribution structure 210 may provide electrical coupling of the conductive connectors 152 of the second package component 200 to the second package component 200. In addition, the lower redistribution structure 212 may provide electrical coupling of the first package component 100 to specific features, such as to the one or more capacitors 204 and to the interconnect structure 206. Although not specifically illustrated, the interconnect structure 206 may be additionally coupled to other packages or devices.

The substrate 208 of the second package component 200 may be formed by any suitable method and may include, for example, a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

In another embodiment, the substrate 202 may be a process controller, such as a digital processing chip (e.g., a multilayer digital processing chip or controller (ML-DPC)). The process controller monitors the outputs of the sensing elements 54 of the first package component 100 and controls the functioning of the sensing elements 54 in coordination with the other devices composing the sensing equipment at large. The substrate 208 may include an integrated circuit having the upper redistribution structure 210 and the lower redistribution structure 212 on opposing sides. As such and although not specifically illustrated, the substrate 208 (e.g., a silicon substrate) may include active and passive devices. A wide variety of devices such as transistors, capacitors, resistors, combinations of these, and the like may be used to generate the structural and functional requirements of the design for the second package components 200. The devices may be formed using any suitable methods.

Although not specifically illustrated, the substrate 208 may also include metallization layers and conductive vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In addition, the through vias 214 may extend through the substrate 208 to electrically couple portions of the upper redistribution structure 210 to portions of the lower redistribution structure 212.

In some embodiments, the substrate is substantially free of active and passive devices and facilitates electrically coupling of the first package component 100 with the one or more capacitors 204 and the interconnect structure 206 of the second package component 200 (e.g., using the through vias 214). In some embodiments, the substrate 202 (e.g., process controller) is formed on a wafer, and then the wafer is singulated into individual components. The one or more capacitors 204 and the interconnect structure 206 may be attached to the lower redistribution structure 212 before or after the singulation process to form the second package component 200. In some embodiments, the one or more capacitors 204 and the interconnect structure 206 are attached to the lower redistribution structure 212 after the first package component 100 is attached to the upper redistribution structure 210.

The second package component 200 may have bond pads 216 on a first side of the upper redistribution structure 210 to couple to the conductive connectors 152 of the first package component 100. In some embodiments, the bond pads 216 are formed by forming recesses (not shown) into dielectric layers (not shown) on the first and second sides of the upper redistribution structure 210. The recesses may be formed to allow the bond pads 216 to be embedded into the dielectric layers. In other embodiments, the recesses are omitted as the bond pads 216 may be formed on the dielectric layer.

After the second package components 200 are formed, the first package component 100 is mechanically and electrically bonded to the second package component 200 by way of the conductive connectors 152 of the first package component 100 and the upper redistribution structure 210 of the second package component 200.

In some embodiments, a solder resist (not shown) is formed on the upper redistribution structure 210. The conductive connectors 152 may be disposed in openings in the solder resist to be electrically and mechanically coupled to conductive features (e.g., the bond pads 216) in the second package component 200. The solder resist may be used to protect areas of the second package component 200 (e.g., the upper redistribution structure 210 and/or the substrate 208) from external damage.

In some embodiments, the conductive connectors 152 have an epoxy flux (not shown) formed thereon before they are reflowed with at least some of the epoxy portion of the epoxy flux remaining after the first package component 100 is attached to the second package component 200.

In some embodiments, an underfill (not shown) is formed between the first package component 100 and the second package component 200, surrounding the conductive connectors 152. The underfill may reduce stress and protect the joints resulting from the reflowing of the conductive connectors 152. The underfill may be formed by a capillary flow process after the first package component 100 is attached, or may be formed by a suitable deposition method before the first package component 100 is attached. In embodiments where the epoxy flux is formed, it may act as the underfill.

The first package component 100 may be implemented in other devices. stacks. For example, a PoP structure is shown, but the first package component 100 may also be implemented in a Flip Chip Ball Grid Array (FCBGA) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. The formation of the dielectric layer 68 as described above may improve efficiency and yield of the overall manufacturing process. In particular, the dielectric layer 68 is formed to be stable during subsequent processing steps. For example, the dielectric layer 68 has a high glass transition temperature and decomposition temperature, which allow the dielectric layer 68 to maintain a substantially same composition, robust adhesion to the substrate 52 and the passivation film 64, and avoid deformation during subsequent steps that, for example, may use elevated temperatures (e.g., formation of the encapsulant 120). The good tensile strength and high Young's Modulus provide additional durability and adhesion to the substrate 52 and the passivation film 64 during subsequent planarization (e.g., grinding) of the encapsulant 120. In addition, the particular composition of the dielectric layer 68 (e.g., a polyimide with an ester group) facilitates fast and efficient removal using a wet etching process.

In an embodiment, a method includes attaching an integrated circuit die adjacent to a first substrate, the integrated circuit die includes an active device in a second substrate; a pad adjacent to the second substrate; and a first dielectric layer adjacent to the second substrate, the first dielectric layer comprising a polyimide with an ester group; forming an encapsulant around the integrated circuit die; and removing the first dielectric layer. In an embodiment, the removing the first dielectric layer includes an isotropic etch. In an embodiment, a sidewall of the first dielectric layer at the encapsulant includes a convex curvature. In an embodiment, the method further includes forming a through via adjacent to the first substrate, and wherein after attaching the integrated circuit die, the through via is laterally displaced from the integrated circuit die. In an embodiment, the method further includes before forming the through via, forming a first redistribution structure adjacent to the first substrate; and after removing the first dielectric layer, forming a second redistribution structure adjacent to the integrated circuit die. In an embodiment, the first redistribution structure is electrically coupled to the through via, and wherein the second redistribution structure is electrically coupled to the through via and to the pad of the integrated circuit die. In an embodiment, the method further includes forming an opening in the second redistribution structure; removing the first substrate; forming a conductive connector adjacent to the first redistribution structure; and attaching the conductive connector to a second package component, after attaching the conductive connector the opening remaining in the second redistribution structure. In an embodiment, the first dielectric layer includes a chemical structure as shown:

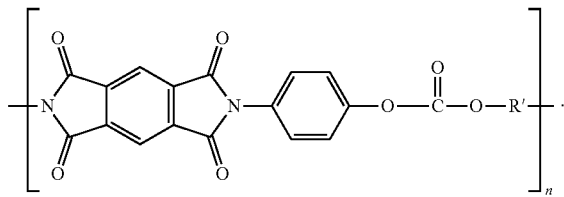

In an embodiment, a method includes forming sensing features adjacent to a first substrate; forming a pad adjacent to the first substrate, the pad being laterally displaced from the sensing features; forming a first dielectric layer adjacent to the sensing features and the pad, the first dielectric layer includes a polyimide, the polyimide includes an electron-attracting functional group; performing a laser grooving on the first dielectric layer and the first substrate, wherein after the laser grooving the first dielectric layer includes curved sidewalls; and singulating the first substrate to form an integrated circuit die. In an embodiment, the method further includes forming a through via adjacent to a second substrate; attaching the integrated circuit die to the second substrate; forming an encapsulant around the through via and the integrated circuit die; removing the first dielectric layer using a wet etchant; forming a first redistribution structure adjacent to and electrically coupled to the through via and the integrated circuit die; singulating the second substrate to form a first package component; and attaching the first package component to a second package component. In an embodiment, the electron-attracting functional group includes an ester group. In an embodiment, the polyimide includes a repeating structure with the ester group bonded to an imide group in series. In an embodiment, the wet etchant includes tetramethylammonium hydroxide. In an embodiment, the removing the first dielectric layer includes an isotropic etching process. In an embodiment, the second substrate includes a second redistribution layer, and wherein the method further includes removing the second substrate; and forming a conductive connector adjacent to the through via. In an embodiment, after attaching the first package component to the second package component, the conductive connector is electrically interposed between the second redistribution layer and the second package component.

In an embodiment, a semiconductor device includes a through via coupled to a first redistribution structure; an integrated circuit die adjacent to the first redistribution structure and laterally displaced from the through via; a dielectric layer adjacent to the integrated circuit die; and an encapsulant around the through via, the integrated circuit die, and at least a portion of the dielectric layer, the dielectric layer having a first width proximal to the integrated circuit die and a second width near an upper surface of the encapsulant, the upper surface of the encapsulant facing away from the first redistribution structure, the first width being greater than the second width. In an embodiment, the semiconductor device further includes a second redistribution structure electrically coupled to the through via and to the integrated circuit die; and a conductive connector adjacent to and electrically coupled to the first redistribution structure. In an embodiment, the dielectric layer extends along the upper surface of the encapsulant. In an embodiment, the dielectric layer includes a convex sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
attaching an integrated circuit die adjacent to a first substrate, the integrated circuit die comprising:
an active device in a second substrate;
a pad adjacent to the second substrate; and
a first dielectric layer adjacent to the second substrate, the first dielectric layer comprising a polyimide with an ester group;
forming an encapsulant around the integrated circuit die; and
removing the first dielectric layer, removing the first dielectric layer comprising exposing a sidewall of the encapsulant.

2. The method of claim 1, wherein the removing the first dielectric layer comprises an isotropic etch.

3. The method of claim 2, wherein a sidewall of the first dielectric layer at the encapsulant comprises a convex curvature.

4. The method of claim 1 further comprising forming a through via adjacent to the first substrate, and wherein after attaching the integrated circuit die, the through via is laterally displaced from the integrated circuit die.

5. The method of claim 4 further comprising:
before forming the through via, forming a first redistribution structure adjacent to the first substrate; and
after removing the first dielectric layer, forming a second redistribution structure adjacent to the integrated circuit die.

6. The method of claim 5, wherein the first redistribution structure is electrically coupled to the through via, and wherein the second redistribution structure is electrically coupled to the through via and to the pad of the integrated circuit die.

7. The method of claim 6 further comprising:
forming an opening in the second redistribution structure;
removing the first substrate;
forming a conductive connector adjacent to the first redistribution structure; and
attaching the conductive connector to a second package component, after attaching the conductive connector the opening remaining in the second redistribution structure.

8. The method of claim 1, wherein the first dielectric layer comprises a chemical structure as shown:

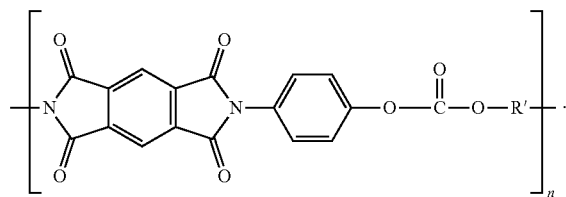

9. A method, comprising:
forming sensing features adjacent to a first substrate;
forming a pad adjacent to the first substrate, the pad being laterally displaced from the sensing features;
forming a first dielectric layer adjacent to the sensing features and the pad, the first dielectric layer comprising a polyimide, the polyimide comprising an electron-attracting functional group;
performing a laser grooving on the first dielectric layer and the first substrate, wherein after the laser grooving the first dielectric layer comprises curved sidewalls;
singulating the first substrate to form an integrated circuit die;
attaching the integrated circuit die to a second substrate; and
removing the first dielectric layer to expose the sensing features and the pad.

10. The method of claim 9 further comprising:
forming a through via adjacent to the second substrate;
forming an encapsulant around the through via and the integrated circuit die;
forming a first redistribution structure adjacent to and electrically coupled to the through via and the integrated circuit die;
singulating the second substrate to form a first package component; and
attaching the first package component to a second package component.

11. The method of claim 10, wherein the electron-attracting functional group comprises an ester group.

12. The method of claim 11, wherein the polyimide comprises a repeating structure with the ester group bonded to an imide group in series.

13. The method of claim 11, wherein removing the first dielectric layer using a wet etchant, and wherein the wet etchant comprises tetramethylammonium hydroxide.

14. The method of claim 10, wherein the second substrate comprises a second redistribution layer, and wherein the method further comprises:
removing the second substrate; and
forming a conductive connector adjacent to the through via.

15. The method of claim 14, wherein after attaching the first package component to the second package component, the conductive connector is electrically interposed between the second redistribution layer and the second package component.

16. The method of claim 9, wherein the removing the first dielectric layer comprises an isotropic etching process.

17. A method, comprising:
forming an integrated circuit die, forming the integrated circuit die comprising:
forming a sensing feature and a conductive pad over a wafer substrate;
depositing a polyimide layer over the wafer substrate, the sensing features, and the conductive pad; and performing a singulation process through the polyimide layer and the wafer substrate;
attaching the integrated circuit die to a carrier substrate;
forming an encapsulant over the carrier substrate and around the integrated circuit die;
performing a selective etch process on the polyimide layer to form a first opening;
depositing a first dielectric layer over the encapsulant and in the opening;
performing an etch process on the first dielectric layer to form a second opening and a third opening, the second opening exposing the conductive pad, the third opening exposing the sensing feature; and
forming a first redistribution structure over the first dielectric layer and in the second opening and the third opening, the first redistribution structure being electrically connected to the conductive pad.

18. The method of claim 17, wherein a topmost level of the third opening has a first width in the first dielectric layer, wherein the first redistribution structure comprises a second dielectric layer, wherein the second dielectric layer comprises a fourth opening, wherein a topmost level of the fourth opening has a second width in the second dielectric layer, and wherein the second width is greater than the first width.

19. The method of claim 17, further comprising, before attaching the integrated circuit die to the carrier substrate:
forming a second redistribution structure over the carrier substrate; and
forming a conductive via over the second redistribution structure.

20. The method of claim 19, wherein after forming the first redistribution structure, the conductive via electrically interposes the first redistribution structure and the second redistribution structure.

* * * * *